(12) United States Patent
Tseng (10) Patent No.: US 8,576,207 B2
(45) Date of Patent: Nov. 5, 2013

(54) SELF-EMISSION TYPE DISPLAY AND METHOD FOR FABRICATING THE SAME

(75) Inventor: Chang-Ho Tseng, Miaoli County (TW)

(73) Assignee: Chimei Innolux Corporation, Miao-Li County (TW)

( * ) Notice: Subject to any disclaimer, the term of this patent is extended or adjusted under 35 U.S.C. 154(b) by 379 days.

(21) Appl. No.: 12/767,002

(22) Filed: Apr. 26, 2010

(65) Prior Publication Data

US 2010/0277442 A1    Nov. 4, 2010

(30) Foreign Application Priority Data

Apr. 29, 2009  (TW) .............................. 98114200 A (51) Int. Cl.
*G09G 5/00* (2006.01)

(52) U.S. Cl.
USPC .............. 345/204; 345/205; 345/206; 345/76

(58) Field of Classification Search
USPC .................... 345/204–206, 690–694, 76–104
See application file for complete search history.

(56) References Cited

U.S. PATENT DOCUMENTS

| | | | | |
|---|---|---|---|---|
| 6,476,419 B1* | 11/2002 | Yasuda | ............................ | 257/72 |
| 7,592,982 B2* | 9/2009 | Kwak | .............................. | 345/76 |
| 8,125,415 B2* | 2/2012 | Koyama et al. | .................. | 345/76 |
| 2007/0085847 A1* | 4/2007 | Shishido | ........................ | 345/204 |
| 2007/0146252 A1* | 6/2007 | Miller et al. | ...................... | 345/77 |
| 2008/0007492 A1* | 1/2008 | Koh et al. | ......................... | 345/76 |
| 2009/0115705 A1* | 5/2009 | Miller et al. | ..................... | 345/76 |

FOREIGN PATENT DOCUMENTS

TW           435053         5/2001

OTHER PUBLICATIONS

Chinese language office action dated Jun. 5, 2013.
English language translation of abstract of TW 435053 (published May 16, 2001).

* cited by examiner

*Primary Examiner* — Christopher E Leiby
(74) *Attorney, Agent, or Firm* — McClure, Qualey & Rodack, LLP (57) ABSTRACT

A system for displaying images is provided. The system includes a self-emission type display device including a substrate, a first sub-pixel unit disposed on the substrate, and a second sub-pixel unit disposed on the substrate and adjacent to the first sub-pixel unit. Each of the first and second sub-pixel units comprises a light-emitting device, a power line electrically connected to the light-emitting device, and a storage capacitor having an electrode electrically connected to the power line. The electrodes of the storage capacitors of the first and second sub-pixel units are formed of a continuous conductive layer, such that the power lines of the first and second sub-pixel units are electrically connected to each other through the continuous conductive layer.

17 Claims, 8 Drawing Sheets

SELF-EMISSION TYPE DISPLAY AND METHOD FOR FABRICATING THE SAME

This Application claims priority of Taiwan Patent Application No. 098114200, filed on Apr. 29, 2009, the entirety of which is incorporated by reference herein.

BACKGROUND OF THE INVENTION

1. Field of the Invention

The invention relates to flat panel display (FPD) technology, and in particular to a self-emission type FPDs, in which a material layer used for fabrication of the active layers or the gate electrode layers in thin film transistors is employed as an electrical connection to the power lines that are used for the light-emitting devices.

2. Description of the Related Art

Figure 1:
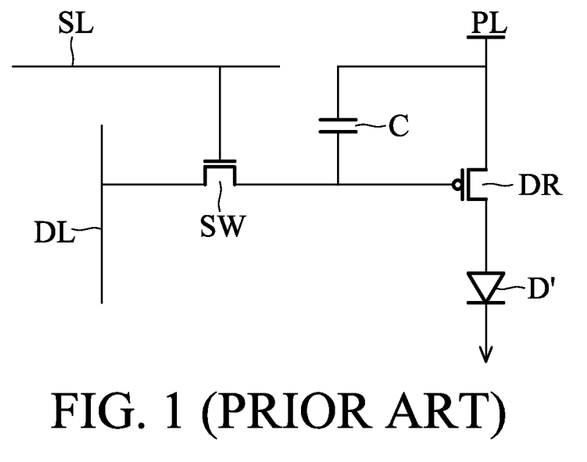
FIG. 1 is a circuit diagram of a sub-pixel unit for a self-emission type display device.

The demand for flat panel displays (FPDs), such as self-emission type FDPs, has increased rapidly in recent years. Self-emission type FDPs, such as active matrix organic light-emitting device (AMOLED) displays, typically employ an organic light-emitting diode (OLED) as a light-emitting device in a pixel region for displaying images. In a sub-pixel array of an AMOLED display, each sub-pixel unit typically includes a sub-pixel unit circuit constituted by a data line DL, a scan line SL, a power line PL, a switching thin film transistor (TFT) SW, a driving TFT DR, a storage capacitor C, and a light-emitting diode D', as shown in FIG. 1.

In AMOLED products, the power line width is designed as wide as possible in order to reduce the voltage drop when a large current passes therethrough. Moreover, in order to improve the voltage uniformity at the source terminal of each driving TFT, the power lines are usually designed and fabricated to form a meshed structure, such that the power lines corresponding to the sub-pixels in each row of the pixel array can be electrically connected to each other. Since the power lines have a meshed structure and the data lines are fabricated by the same metal layer, portions of the meshed structure formed by power lines must extend across the data lines. Accordingly, in the circuit design, the intersections between the data lines and the portions of the meshed structure formed by power lines extended across the data lines must have additional interconnection bridges (which includes at least two via holes), and thus increases layout and fabrication complexity. Moreover, since each pixel size is limited by the area used for fabricating the meshed structure, further increasing display resolution (pixel per inch, ppi) is limited.

Therefore, a need exists in the art for development of an improved power line structure for OLED displays, capable of improving voltage uniformity while increasing display resolution.

BRIEF SUMMARY OF THE INVENTION

A detailed description is given in the following embodiments with reference to the accompanying drawings. Systems for displaying images are provided. An exemplary embodiment of a system for displaying images comprises a self-emission type display device comprising a substrate, a first sub-pixel unit disposed on the substrate, and a second sub-pixel unit disposed on the substrate and adjacent to the first sub-pixel unit. The first sub-pixel unit comprises a first light-emitting device, a first power line electrically connected to the first light-emitting device, and a first storage capacitor having a first electrode electrically connected to the first power line. The second sub-pixel unit comprises a second light-emitting device, a second power line electrically connected to the second light-emitting device, and a second storage capacitor having a second electrode electrically connected to the second power line. The first and second electrodes are formed of a first continuous conductive layer, such that the first power line is electrically connected to the second power line through the first continuous conductive layer.

Another exemplary embodiment of a system for displaying images comprises a self-emission type display device comprising a substrate, a first sub-pixel unit disposed on the substrate, and a second sub-pixel unit disposed on the substrate and adjacent to the first sub-pixel unit. The first sub-pixel unit comprises a first light-emitting device, a first power line electrically connected to the first light-emitting device, a first storage capacitor having a first metal electrode electrically connected to the first power line, and a first driving transistor having a first source doping region electrically connected to the first power line to drive the first light-emitting device. The second sub-pixel unit comprises a second light-emitting device, a second power line electrically connected to the second light-emitting device, a second storage capacitor having a second metal electrode electrically connected to the second power line, and a second driving transistor having a second source doping region electrically connected to the second power line to drive the second light-emitting device. The first and second source doping regions are formed of a continuous conductive layer, such that the first power line is electrically connected to the second power line through the continuous conductive layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 2:
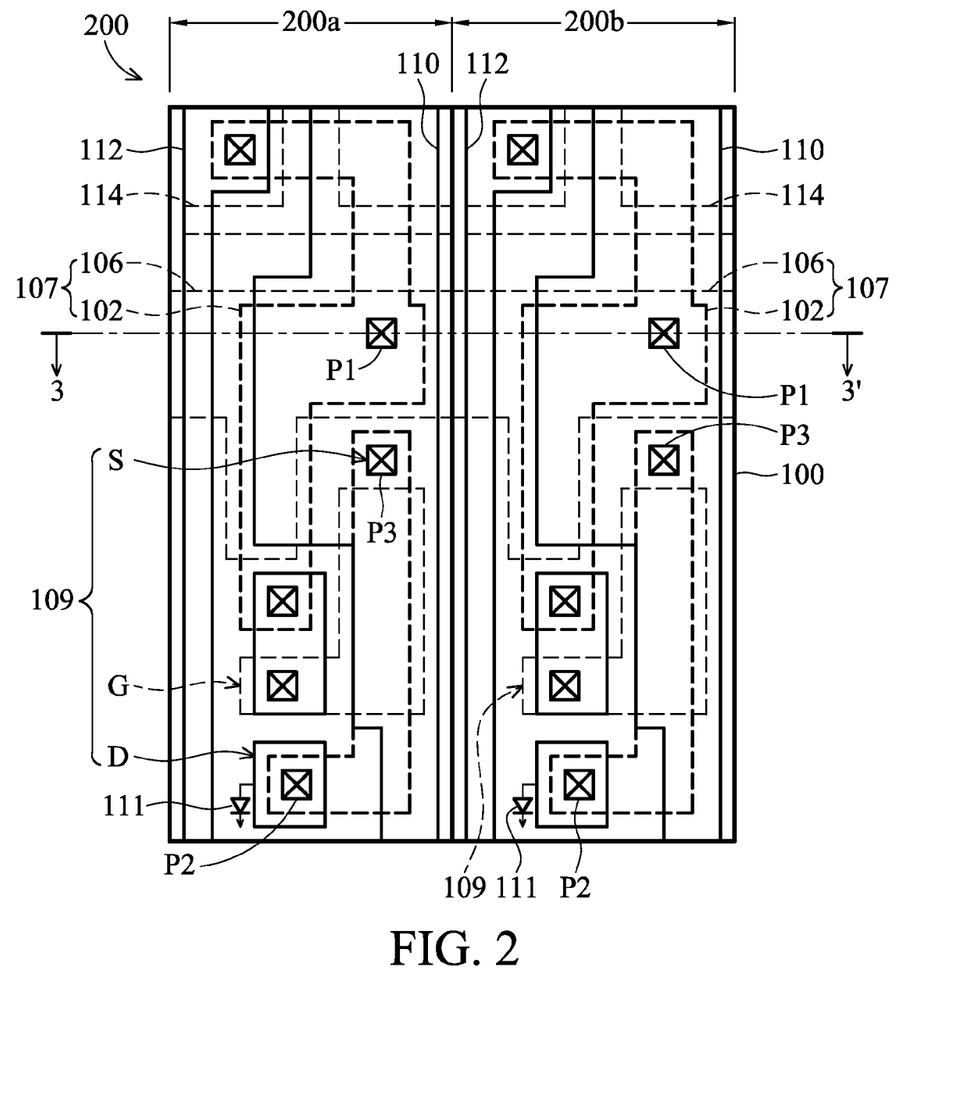
FIG. 2 is a plan view of an embodiment of a system for displaying images including a self-emission type display device according to the invention.
Figure 3:
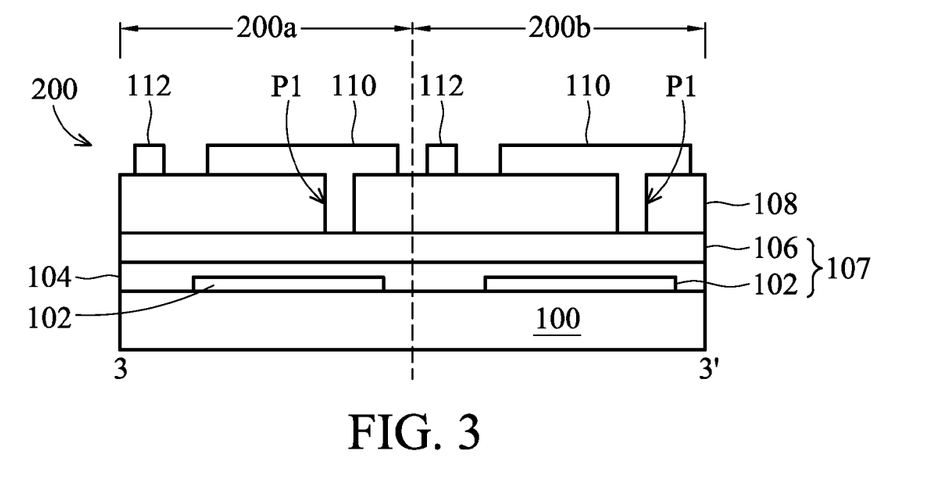
FIG. 3 is a cross section along the 3-3' line shown in FIG. 2.

Systems for displaying images are provided. Referring to FIGS. 2 and 3, FIG. 2 is a plan view of an embodiment of a system for displaying images including a self-emission type display device according to the invention and FIG. 3 is a cross section along the 3-3' line shown in FIG. 2. The self-emission type display device 200 comprises a substrate 100 and a plurality of sub-pixel units disposed thereon and arranged as an array. In order to simplify the diagram, only a first sub-pixel unit 200a and a second sub-pixel unit 200b adjacent thereto for displaying different primary colors are depicted. The substrate 100 may comprise glass, quartz, or other transparent materials. Typically, the sub-pixel unit comprises a driving TFT to drive a light-emitting device, a switching TFT to switch the turn on/off states of the sub-pixel unit, a storage capacitor to store image data, a scan line to control the switching TFT, a data line to transmit image data, and a power line to apply a voltage to the light-emitting device via the driving TFT.

In the embodiment, each of the first and second sub-pixel units 200a and 200b comprises a power line 110, a data line 112, a scan line 114, a storage capacitor 107, a driving TFT 109, a light-emitting device 111, and a switching TFT (not shown).

The light-emitting device 111, such as an organic light-emitting diode (OLED) is electrically connected to the drain D of the driving TFT 109 via a conductive plug P2, and electrically connected to the source S of the driving TFT 109 via a conductive plug P3, so as to be electrically connected to the power line 110.

The storage capacitor 107 comprises a lower electrode 102, an upper electrode 106, and a capacitor dielectric layer 104 interposed therebetween. In the embodiment, the lower electrode 102 may comprise a semiconductor material, such as doped polysilicon. The upper electrode 106 may comprise metal, such as molybdenum (Mo) or an alloy thereof. The capacitor dielectric layer 104 may comprise silicon oxide, silicon nitride, or a combination thereof. The lower electrode 102 is electrically connected to the drain of the switching TFT and the gate G of the driving TFT 109. Moreover, as shown in FIG. 3, the upper electrode 106 is electrically connected to the power line 110 via a conductive plug P1 in an insulating layer 108 on the upper electrode 106. The insulating layer 108 is used as a protective, planarization, or intervening layer or a combination thereof and may comprise silicon oxide, silicon nitride, or a combination thereof.

In particular, in the embodiment, the upper electrodes 106 of the storage capacitors 107 in the first and second sub-pixel units 200a and 200b are formed of a continuous conductive layer, such as a continuous metal layer. As a result, the power lines 110 in the first and second sub-pixel units 200a and 200b are electrically connected to each other through the continuous conductive layer. Accordingly, in the sub-pixel unit array, two or more than two power lines in the same row sub-pixel units can be electrically connected to each other through the continuous conductive layer. In another embodiment, a plurality of sets of electrically connected power lines in the same row sub-pixel units can be formed through two or more than two continuous conductive layers. In one embodiment, at least a portion of the continuous conductive layer is substantially perpendicular to the extending direction of the power lines 110 in the first and second sub-pixel units 200a and 200b.

The data line 112 and the power line 110 on the insulating layer 108 can be formed by patterning the same conductive layer comprising aluminum (Al), molybdenum (Mo), titanium (Ti), or a combination thereof.

Figure 4:
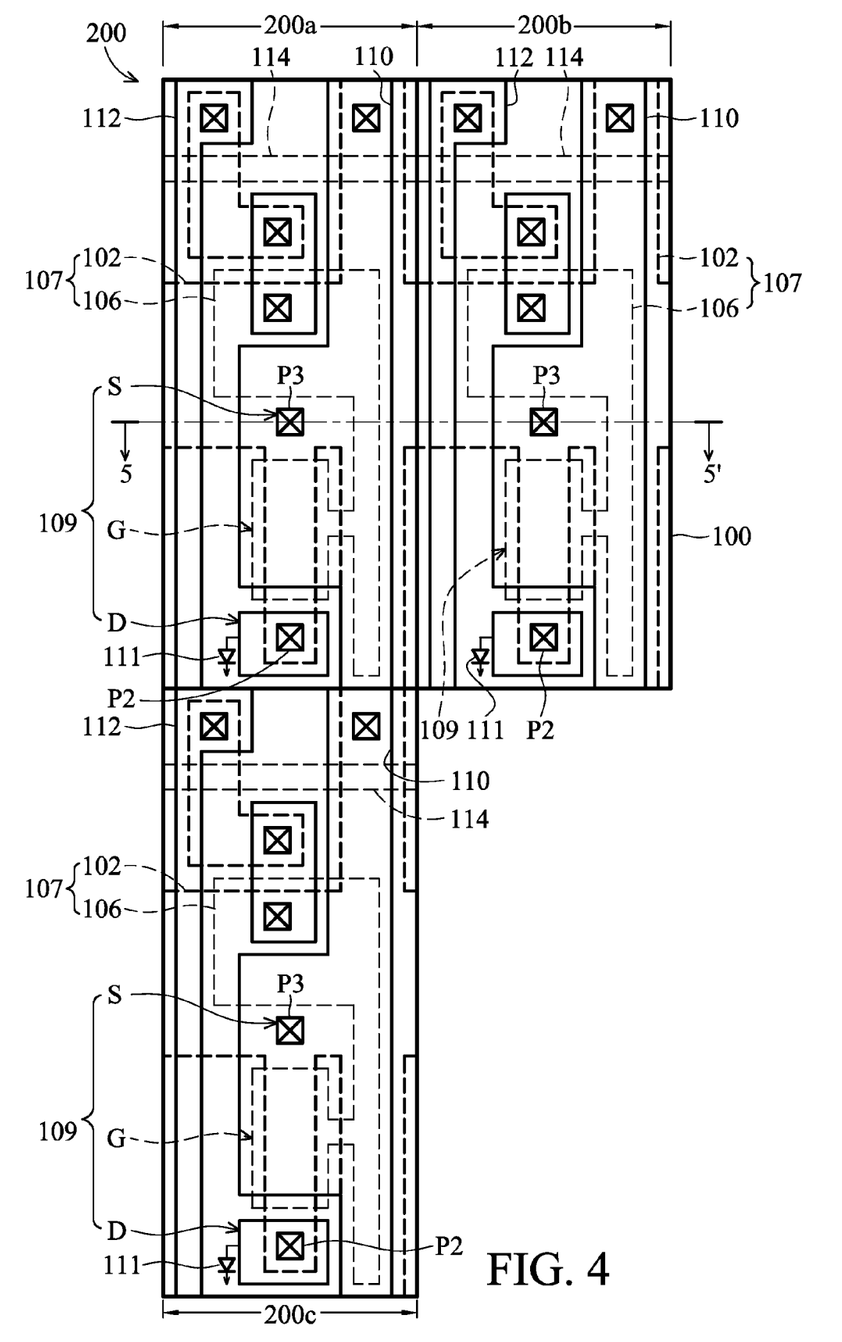
FIG. 4 is a plan view of another embodiment of a system for displaying images including a self-emission type display device according to the invention.
Figure 5:
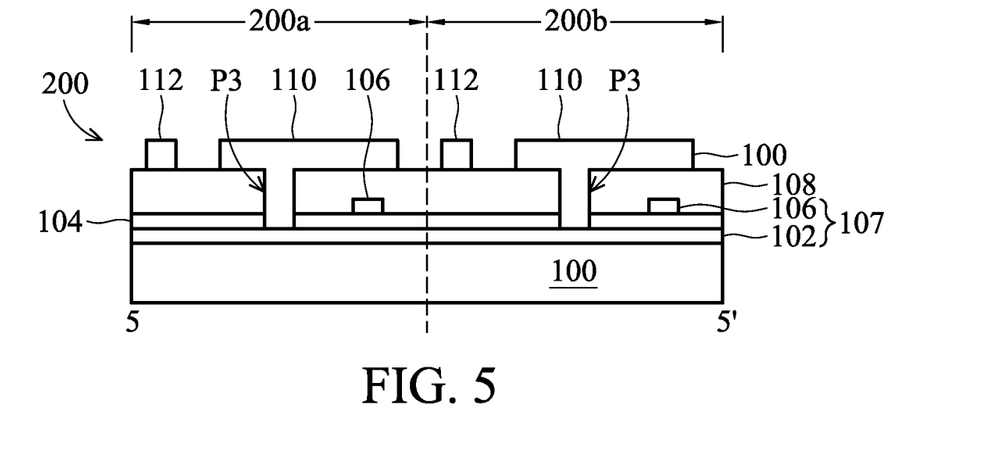
FIG. 5 is a cross section along the 5-5' line shown in FIG. 4.

Referring to FIGS. 4 and 5, FIG. 4 is a plan view of another embodiment of a system for displaying images including a self-emission type display device according to the invention and FIG. 5 is a cross section along the 5-5' line shown in FIG. 4. Elements in FIGS. 4 and 5 that are the same as those in FIGS. 2 and 3 are labeled with the same reference numbers as in FIGS. 2 and 3 and are not described again for brevity. In the embodiment, a third sub-pixel unit 200c is adjacent to the first sub-pixel unit 200a for displaying the same primary color. Moreover, as shown in FIG. 5, the upper electrode 106 is electrically connected to the drain of the switching TFT and the gate G of the driving TFT 109 and the lower electrode 102 is electrically connected to the power line 110 through the conductive plug P3 in the insulating layer 108 on the lower electrode 102. In particular, the lower electrode 102 of the storage capacitors 107 in the first and second sub-pixel units 200a and 200b are formed of a continuous conductive layer. In the embodiment, the lower electrode 102 of the storage capacitors 107 in the third sub-pixel unit 200c is also formed of the continuous conductive layer. The continuous conductive layer may comprise a semiconductor material, such as doped polysilicon. Also, the power lines 110 in the first, second, and third sub-pixel units 200a, 200b, and 200c are electrically connected to each other through the continuous conductive layer employed to form the lower electrodes 102.

In the sub-pixel unit array, the power lines in the same row and/or the same column sub-pixel units can be electrically connected to each other through the continuous conductive layer. In another embodiment, a plurality of sets of electrically connected power lines in the same row and/or the same column sub-pixel units can be formed through two or more than two continuous conductive layers. In one embodiment, at least a portion of the continuous conductive layer is substantially perpendicular to the extending direction of the power lines 110 in the first, second, and third sub-pixel units 200a, 200b, and 200c.

In some embodiments, in the sub-pixel unit array, some of power lines 110 can be electrically connected to each other through the continuous conductive layer employed to form the upper electrode 106 (as shown in FIGS. 2 and 3) and some of them can be electrically connected to each other through the continuous conductive layer employed to form the lower electrode 102 (as shown in FIGS. 4 and 5).

Figure 6:
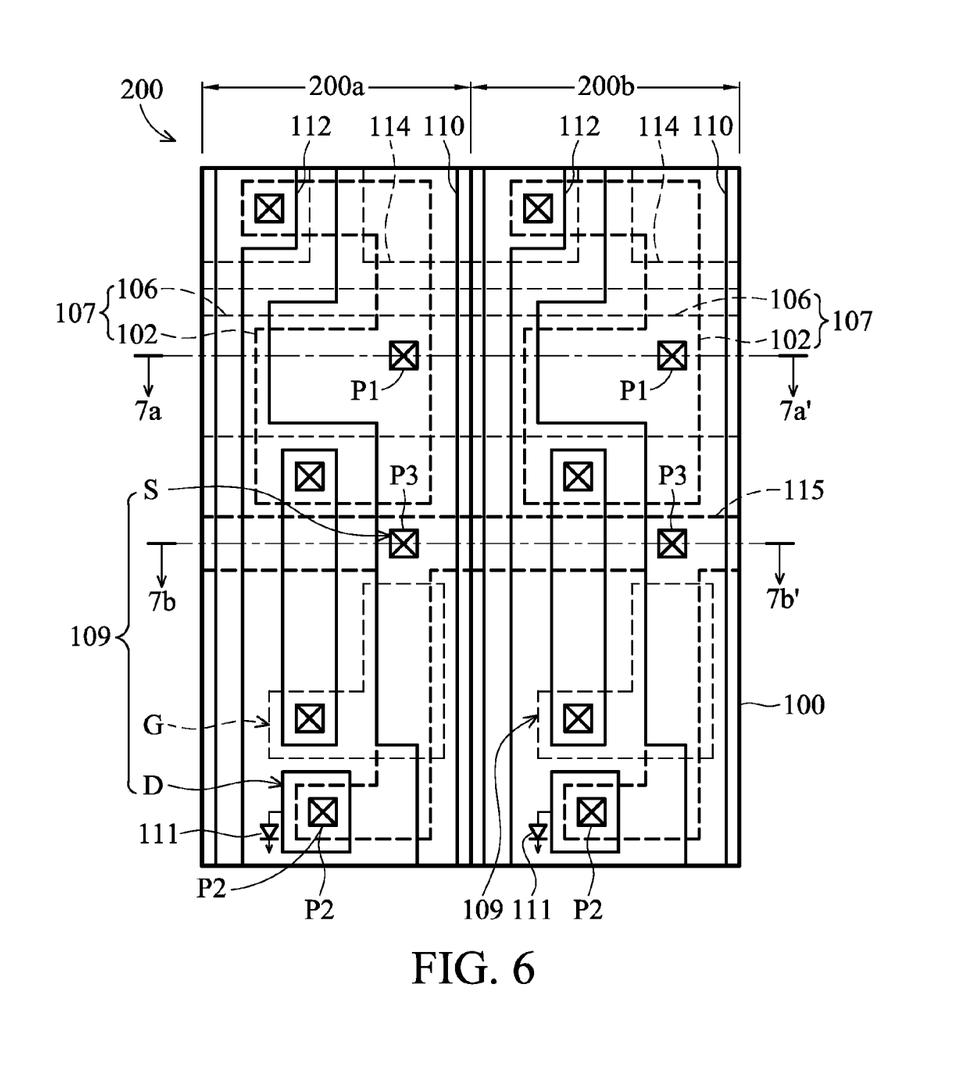
FIG. 6 is a plan view of yet another embodiment of a system for displaying images including a self-emission type display device according to the invention.
Figure 7A:
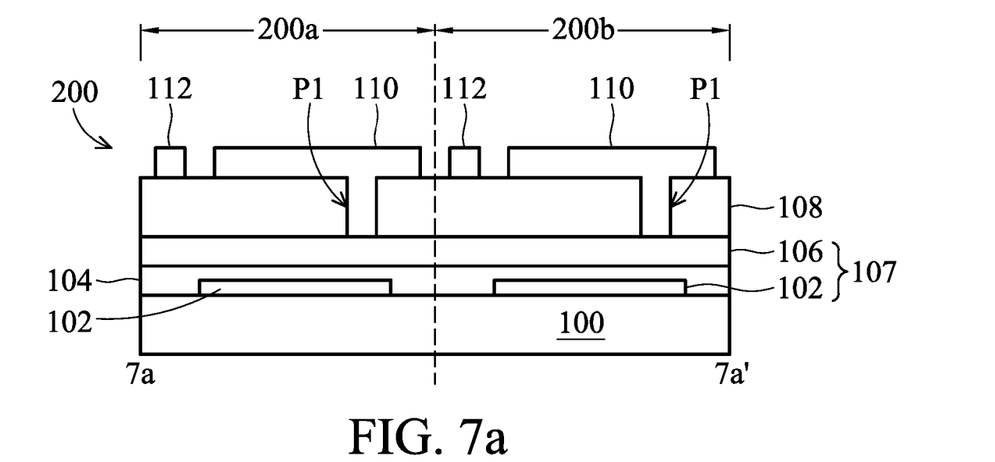
FIG. 7a is a cross section along the 7a-7a' line shown in FIG. 6.
Figure 7B:
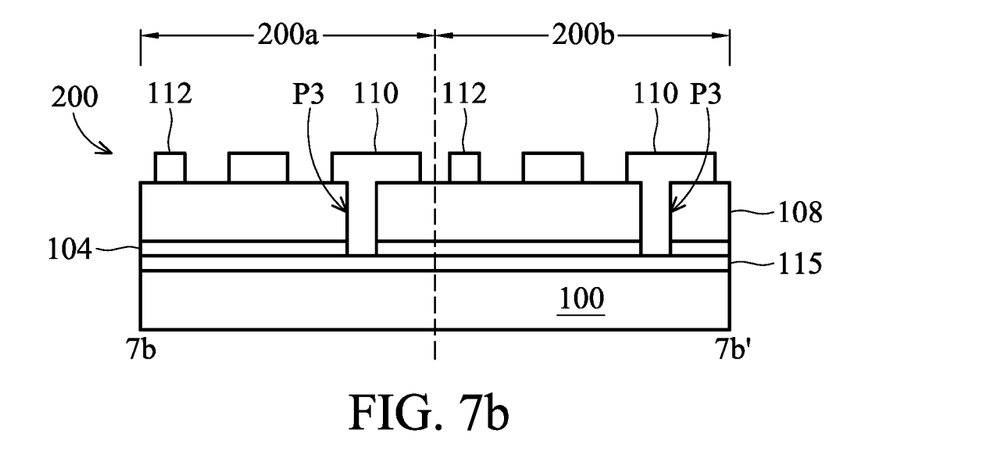
FIG. 7b is a cross section along the 7b-7b' line shown in FIG. 6.

Referring to FIGS. 6, 7a, and 7b, FIG. 6 is a plan view of yet another embodiment of a system for displaying images including a self-emission type display device according to the invention, FIG. 7a is a cross section along the 7a-7a' line shown in FIG. 6, and FIG. 7b is a cross section along the 7b-7b' line shown in FIG. 6. Elements in FIGS. 6, 7a, and 7b that are the same as those in FIGS. 2 and 3 are labeled with the same reference numbers as in FIGS. 2 and 3 and are not described again for brevity. In the embodiment, the lower electrode 102 of the storage capacitor 107 comprises a semiconductor material, such as doped polysilicon, and the upper electrode 106 of the storage capacitor 107 comprises metal, such as Mo or Mo alloy. The upper electrode 106 is electrically connected to the power line 110 through the conductive plug P1 in the insulting layer 108 on the upper electrode 106. Moreover, the driving TFT 109 has a source doping region 115 electrically connected to the power line 110 through the conductive plug P3 in the insulting layer 108 on the source doping region 115.

In particular, the source doping regions 115 of the driving TFTs 109 in the first and second sub-pixel units 200a and 200b are formed of a continuous conductive layer, such as doped polysilicon. As a result, the power lines 110 in the first and second sub-pixel units 200a and 200b are electrically connected to each other through the continuous conductive layer employed to form the source doping regions 115, as shown in FIGS. 6 and 7b. Moreover, the upper electrodes 106 (i.e. the metal electrodes) of the storage capacitors 107 in the first and second sub-pixel units 200a and 200b are formed of a continuous metal layer, as shown in FIGS. 6 and 7a. As a result, the power lines 110 in the first and second sub-pixel units 200a and 200b are also electrically connected to each other through the continuous metal layer. In some embodiments, the power lines 110 in the first and second sub-pixel units 200a and 200b are electrically connected to each other merely through the continuous conductive layer employed to form the source doping regions 115. The upper electrodes 106 of the storage capacitors 107 in the first and second sub-pixel units 200a and 200b are isolated from each other, such that the power lines 110 in the first and second sub-pixel units 200a and 200b are not electrically connected to each other through the upper electrodes 106. In one embodiment, at least a portion of the continuous conductive layer and at least a portion of the continuous metal layer are substantially perpendicular to the extending direction of the power lines 110 in the first and second sub-pixel units 200a and 200b.

According to the embodiments, since two or more than two power lines in the same row, the same column, or different rows and columns sub-pixel units in the sub-pixel array are electrically connected to each other, the voltage uniformity at the source terminal of each driving TFT can be improved. Moreover, since the power lines in the sub-pixel units are electrically connected to each other through the continuous metal or semiconductor layer under the power and data lines, the circuit layout and the fabrication can be simplified without limiting each pixel size. Thus, the display resolution can be increased.

Figure 8:
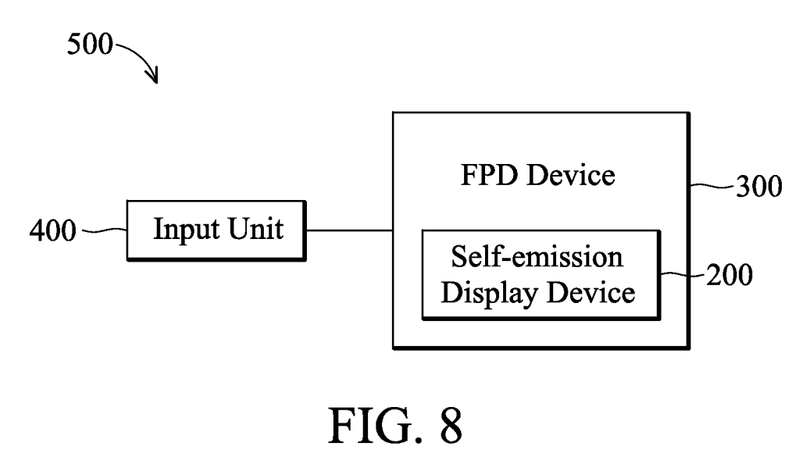
FIG. 8 schematically shows another embodiment of a system for displaying images.

FIG. 8 schematically shows another embodiment of a system for displaying images which, in this case, is implemented as a flat panel display (FPD) device 300 or an electronic device 500 such as a laptop computer, a mobile phone, a digital camera, a personal digital assistant (PDA), a desktop computer, a television, a car display or a portable DVD player. The described self-emission type display device 200 can be incorporated into the flat panel display device 300 that can be an OLED display. In FIG. 8, the flat panel display device 300 comprises a self-emission type display device, as the self-emission type display device 200 shown in FIGS. 2 to 7. In some embodiments, the self-emission type display device 200 can be incorporated into the electronic device 500. As shown in FIG. 8, the electronic device 500 comprises the FPD device 300 and an input unit 400. Moreover, the input unit 400 is coupled to the FPD device 300 and operative to provide input signals (e.g. image signals) to the FPD device 300 to generate images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
a self-emission type display device, comprising:
a substrate;
a first sub-pixel unit disposed on the substrate, comprising:
a first light-emitting device;
a first power line electrically connected to the first light-emitting device; and
a first storage capacitor having a first electrode electrically connected to the first power line; and
a second sub-pixel unit disposed on the substrate and adjacent to the first sub-pixel unit, comprising:
a second light-emitting device;
a second power line electrically connected to the second light-emitting device; and
a second storage capacitor having a second electrode electrically connected to the second power line,
wherein the first and second electrodes are directly connected to form a first continuous conductive layer, such that the first power line and the second power line are connected to the first continuous conductive layer.

2. The system of claim 1, wherein the self-emission type display device further comprises:
a third sub-pixel unit disposed on the substrate and adjacent to the first sub-pixel unit, comprising:
a third light-emitting device;
a third power line electrically connected to the third light-emitting device; and
a third storage capacitor having a third electrode electrically connected to the third power line,
wherein the third electrode is formed of the first continuous conductive layer, such that the first, second, and third power lines are electrically connected to each other through the first continuous conductive layer.

3. The system of claim 1, wherein the first continuous conductive layer comprises metal.

4. The system of claim 1, wherein the first continuous conductive layer comprises a semiconductor material.

5. The system of claim 1, wherein at least a portion of the first continuous conductive layer is substantially perpendicular to the extending direction of the first and second power lines.

6. The system as claimed in claim 1, further comprising:
a flat panel display device comprising the self-emission type display device; and
an input unit coupled to the flat panel display device and operative to provide input singles to the flat panel display device, such that the flat panel display device displays images.

7. The system of claim 6, wherein the flat panel display device is an organic light-emitting diode display.

8. The system of claim 6, wherein the system comprises an electronic device comprising the flat panel display device.

9. The system of claim 8, wherein the electronic device is a laptop computer, a mobile phone, a digital camera, a personal digital assistant, a desktop computer, a television, a car display or a portable DVD player.

10. A system for displaying images, comprising:
a self-emission type display device, comprising:
a substrate;
a first sub-pixel unit disposed on the substrate, comprising:
a first light-emitting device;
a first power line electrically connected to the first light-emitting device; and
a first storage capacitor having a first metal electrode electrically connected to the first power line; and
a first driving transistor having a first source doping region electrically connected to the first power line to drive the first light-emitting device; and
a second sub-pixel unit disposed on the substrate and adjacent to the first sub-pixel unit, comprising:
a second light-emitting device;
a second power line electrically connected to the second light-emitting device;
a second storage capacitor having a second metal electrode electrically connected to the second power line; and
a second driving transistor having a second source doping region electrically connected to the second power line to drive the second light-emitting device, wherein the first and second source doping regions are formed of a continuous conductive layer directly connected to one another, such that the first power line is electrically connected to the second power line through the continuous conductive layer.

11. The system of claim 10, wherein the continuous conductive layer comprises doped polysilicon.

12. The system of claim 10, wherein at least a portion of the continuous conductive layer is substantially perpendicular to the extending direction of the first and second power lines.

13. The system of claim 10, wherein the first and second metal electrodes are formed of a continuous metal layer, such that the first power line is electrically connected to the second power line through the continuous metal layer.

14. The system as claimed in claim 10, further comprising:
   a flat panel display device comprising the self-emission type display device; and
   an input unit coupled to the flat panel display device and operative to provide input singles to the flat panel display device, such that the flat panel display device displays images.

15. The system of claim 14, wherein the flat panel display device is an organic light-emitting diode display.

16. The system of claim 14, wherein the system comprises an electronic device comprising the flat panel display device.

17. The system of claim 16, wherein the electronic device is a laptop computer, a mobile phone, a digital camera, a personal digital assistant, a desktop computer, a television, a car display or a portable DVD player.

* * * * *